Figure 1:
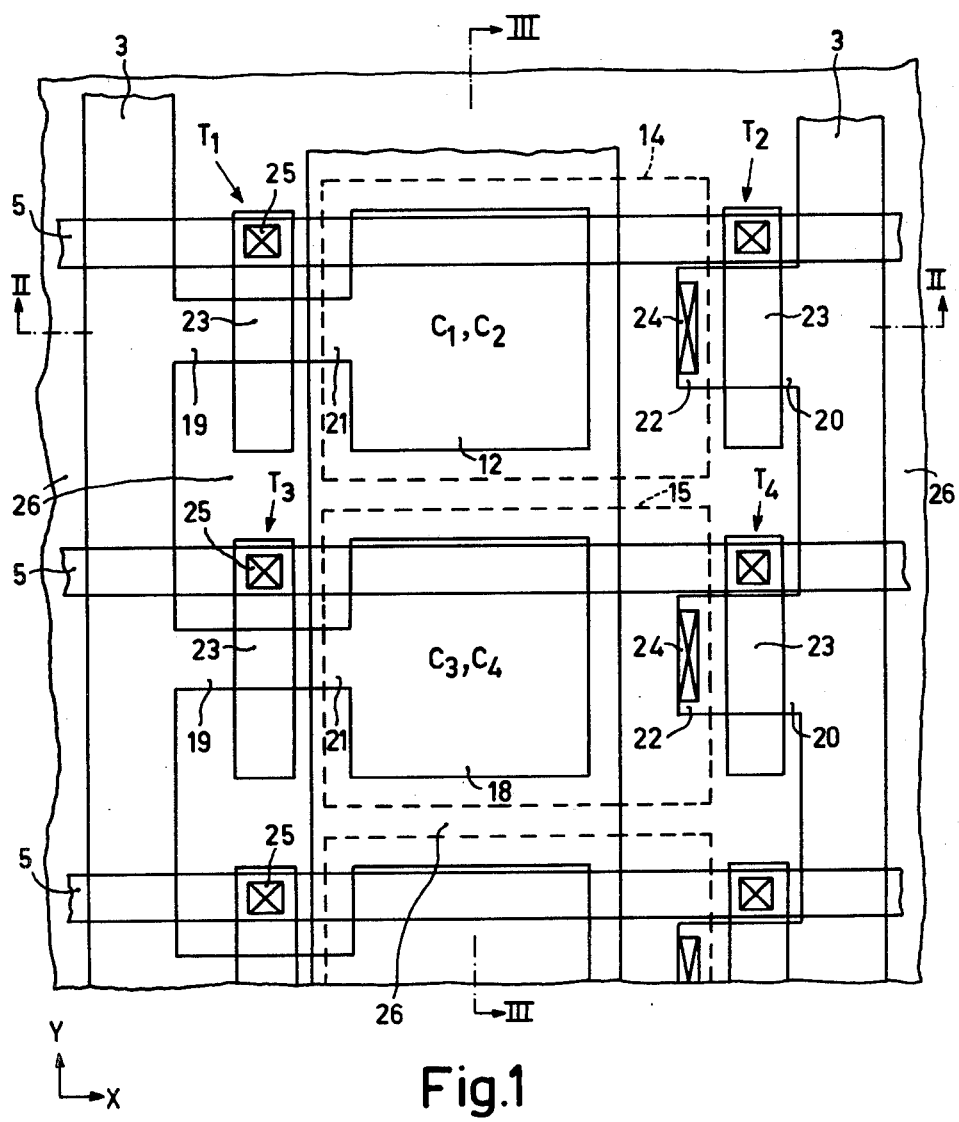

United States Patent [19]

Salters

[11] Patent Number: 4,460,911

[45] Date of Patent: Jul. 17, 1984

[54] SEMICONDUCTOR DEVICE WITH MULTIPLE PLATE VERTICALLY ALIGNED CAPACITOR STORAGE MEMORY

[75] Inventor: Roelof H. W. Salters, Eindhoven, Netherlands

[73] Assignee: U.S. Philips Corporation, New York, N.Y.

[21] Appl. No.: 158,958

[22] Filed: Jun. 12, 1980

Related U.S. Application Data

[63] Continuation of Ser. No. 766,663, Feb. 8, 1977, abandoned.

[30] Foreign Application Priority Data

Feb. 12, 1976 [NL] Netherlands ................. 7601416

[51] Int. Cl.$^3$ .......................................... H01L 29/78
[52] U.S. Cl. ..................................... 357/23.6; 357/41; 357/51; 365/182; 357/23.11; 357/23.14
[58] Field of Search .......... 357/23 C, 23 CS, 23 MG, 357/41, 51; 365/182

[56] References Cited

U.S. PATENT DOCUMENTS 4,131,906 12/1978 Kinoshita ..................... 357/23 C
4,197,554 4/1980 Meusburger et al. ............ 357/41

Primary Examiner—Joseph E. Clawson, Jr.
Attorney, Agent, or Firm—Paul R. Miller

[57] ABSTRACT

A high packing density is obtained in a memory by stacking the capacitors of adjacent columns in such a manner that two capacitors of different columns are formed by three conductive layers situated one above the other. The central layer can be connected to a reference voltage, while the uppermost layer is connected to a transistor in one column and lowermost layer is connected to a transistor in the other column.

19 Claims, 11 Drawing Figures

SEMICONDUCTOR DEVICE WITH MULTIPLE PLATE VERTICALLY ALIGNED CAPACITOR STORAGE MEMORY

This application is a continuation of application Ser. No. 766,663, filing date Feb. 8, 1977, now abandoned and all benefit of this earlier filing date is hereby incorporated into this application.

The invention relates to a semiconductor device for storing and reading information, in particular a random access memory device, comprising a semiconductor body having a surface-adjoining series of capacitors, each forming a memory cell in which information in the form of electric charge can be introduced, in which of each capacitor one electrode, hereinafter termed first electrode, is connected to an electronic switch destined for addressing and the other electrode, hereinafter termed second electrode, can be set up at a reference voltage during operation.

Memory devices with random access are often referred to by RAM, which is abbreviation of the English name "Random Access Memory". In memories of the kind described in the preamble the electronic switches are usually insulated gatefield effect transistors. One of the electrodes of the capacitors is or is being connected electrically to the source zone or the drain zone of the associated transistor, while the other electrodes of the capacitors are applied in common to a reference potential, for example, to ground or to the supply potential. This other electrode may be a region of the semiconductor body which forms a p-n junction with the first-mentioned electrode. Usually, however, the electrode to be applied at the reference potential is formed by a conductive layer which is provided on an insulating layer present on the surface of the body and which forms a so-called MOS capacitance with the underlying semiconductor body. The expression MOS, which is an abbreviation for Metal Oxide Semiconductor, should be understood to include structures in which, instead of a metal layer, a conductive layer of, for example, doped polycrystalline silicon is used, and/or structures in which the dielectric layer consists of an insulating nitride layer or of a combination of various sub-layers, instead of of an oxide. As regards the structure several variations are possible which can each be used advantageously or which can be obtained in accordance with the technology which is used in the manufacture of the device. For example, the transistors and the associated capacitors can be manufactured in a self-registering manner in which, starting from a body of one conductivity, type, a thin insulating layer is provided at least locally on a surface of the body and thereon the gate electrodes of the transistors and the conductive layer forming the second electrodes to be set up at reference potential are provided, after which the source and drain zones of the transistors in the form of surface zones of the opposite conductivity type are provided by diffusion or ion implantation. By means of the second electrodes of the capacitors, depletion regions can be induced in the semiconductor body in which regions minority charge carriers, dependent on the introduced signal, can be introduced via the transistor, said minority charge carriers forming at the surface of the body an inversion layer of the opposite conductivity type adjoining, for example, the drain zone of the transistor. The electrodes of the capacitors to be set up at reference potential may alternatively be provided after the provision of the source and drain regions of the transistors instead of prior to said provision, in which the drain zones of the transistors may extend to below said electrodes and may themselves form one of the electrodes of the capacitors. Viewed on the surface of the body, the electrode or electrodes to be set up at reference potential may alternatively be provided directly beside the gate electrodes of the transistors above a region of the first conductivity type in which, by means of said electrodes, depletion regions are induced in the semiconductor body which may then be considered as one of the source and drain zones of the transistors, while only the other zone is provided by means of diffusion of a suitable impurity or by ion implantation in the form of surface zone of the opposite conductivity type. In connection herewith, it is to be noted that a field effect transistor is, therefore, to be understood to mean herein not only an element having source and drain zones of the second conductivity type obtained by doping regions of a semiconductor body of the first conductivity type, but also includes elements of which at least one of the source and drain regions is or may be induced by means of an electric field.

Memory devices of the above-described type have the important advantage that, since only one transistor is required per memory cell, they are extremely suitable for integration in the same semiconductor body. As the integration scale increases, for example, in the case of a very large number of integrated memory cells, there also increases the need for reducing the area occupied by each cell because any reduction—even a very small one—of the memory cells individually may result in a considerable reduction of the overall area of the semiconductor body as a result of the large number of cells. As is known, it is always endeavoured generally in semiconductor technology to minimize the overall area of semiconductor devices in particular because in the production the percentage of devices which proves to be useless as a result of defects generally increases very considerably as the device becomes larger.

In order to reduce the area occupied by each memory cell it has already been suggested to change the structure in such manner that the transistor which in conventional devices is situated mainly beside the associated capacitor, is situated below the capacitor. Such a suggestion has been described, inter alia, in an article entitled: "Vertical One-Device Memory-Cell" published in IBM Technical Disclosure Bulletin, Vol. 15, No. 12, May 1973, pp. 3585/6. In the device described in said article the first electrode of the capacitor, which is connected electrically to one of the source and drain zones of the underlying field effect transistor, is formed by a conductive layer of polycrystalline silicon which is deposited on an oxide layer covering the surface of the body and is contacted with one of the zones of the field effect transistor via a contact window in the oxide layer. This silicon layer extends above the whole transistor including the gate electrode which is also manufactured from polycrystalline silicon and which is insulated from the electrode of the capacitor by an intermediate oxide layer. Deposited on the first-mentioned polycrystalline silicon layer is a layer of silicon nitride or aluminium oxide which forms a dielectric layer of the capacitor and on which finally a metal layer is provided which also extends above the whole transistor and forms a memory capacitance with the underlying polycrystalline silicon layer and which can be set up at a suitable reference potential.

In this known device the area occupied by each cell is determined to a considerable extent by the size of the capacitors. These cannot be made arbitrarily small because in that case the capacitances would also be reduced so that the signal strength would come below an admissible value. This means that a further reduction of the memory cells is substantially not possible any more without adversely influencing the electrical properties of the device. One of the objects of the invention is to provide a structure with which a further reduction of the overall area of the device can nevertheless be obtained while maintaining a suitable capacitance per memory cell.

The invention is based inter alia on the recognition that the capacitors, as compared with the transistors, require a comparatively large area and that as a result of this a considerable space saving can be obtained when two capacitors of adjacent memory cells are not provided beside each other, as is usual, but above each other.

According to the invention, a semiconductor device, in particular a memory device, of the kind mentioned in the preamble, is therefore characterized in that the capacitors are subdivided into groups of two in which each group comprises three conductive layers which, viewed on the surface of the body, are situated above each other, the central conductive layer being separated from the uppermost and lowermost conductive layers by barrier layers and forming with said layers the two capacitors of the group, the central conductive layer forming a common second electrode of the capacitors of which the first electrodes are formed by uppermost and the lowermost conductive layers which are connected to different electronic switches.

By providing the capacitors above each other two by two, an important space saving can be obtained as compared with the described known devices. By furthermore using the central conductive layer as a common electrode for the two capacitors, and the semiconductor body—or at least parts thereof which adjoin the surface and are situated below the central electrode—for the lowermost conductive layer, two metallisation layers for the capacitors will suffice so that the device can be manufactured by means of processes conventionally used in semiconductor technology.

An important embodiment of a device according to the invention is characterized in that the memory cells form an xy-system in which the capacitors belonging to the same group form part of memory cells which are connected to the same x-line and lines formed by cells with capacitors formed by the central conductive layer and the lowermost conductive layer and alternated by lines formed by cells with capacitors formed by the central layer and the uppermost layer are connected to an y-line of the system. Therefore, in this embodiment adjacent y-lines are, as it were, partly slid one into the other.

Figure 2:
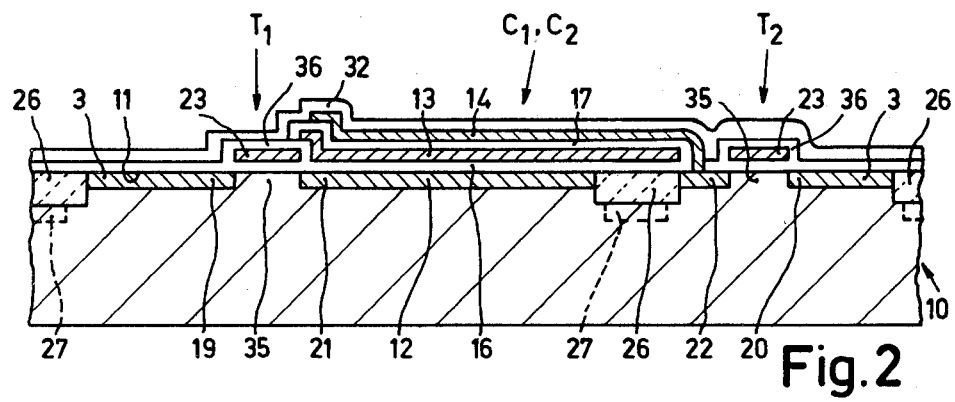
Figure 3:
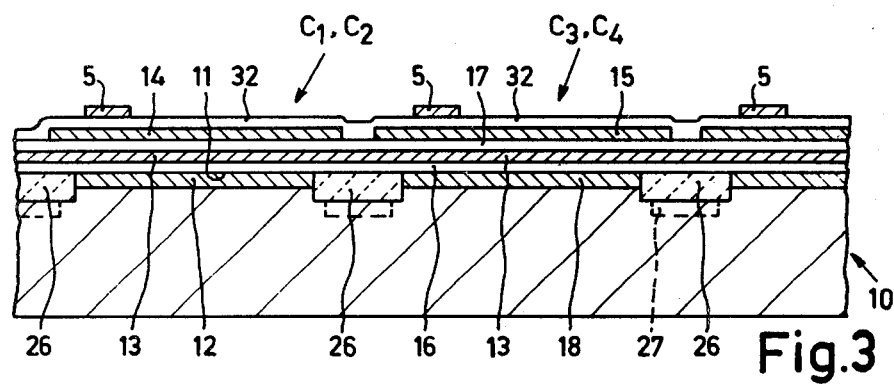
Figure 4:
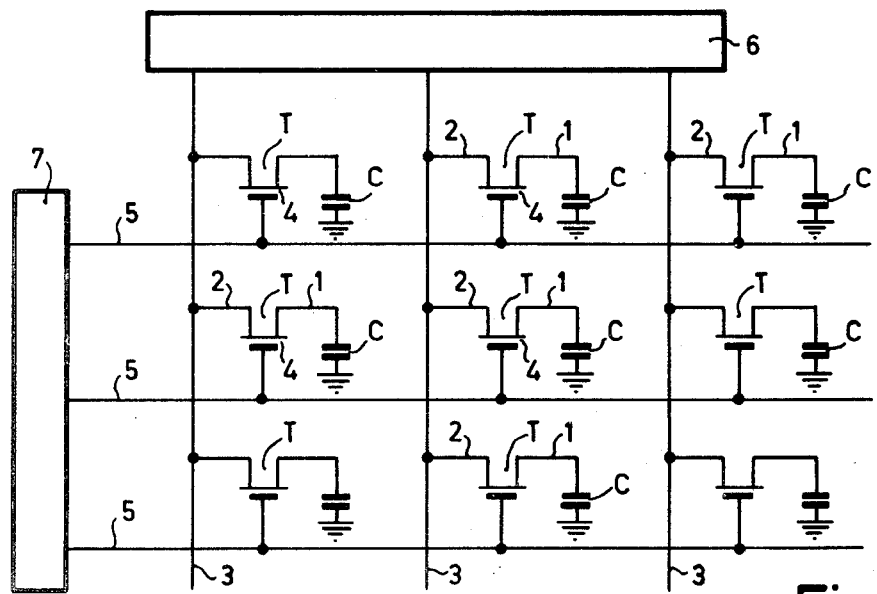
Figure 5:
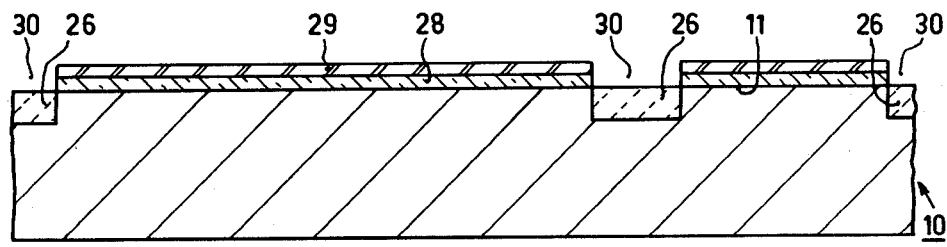
Figure 6:
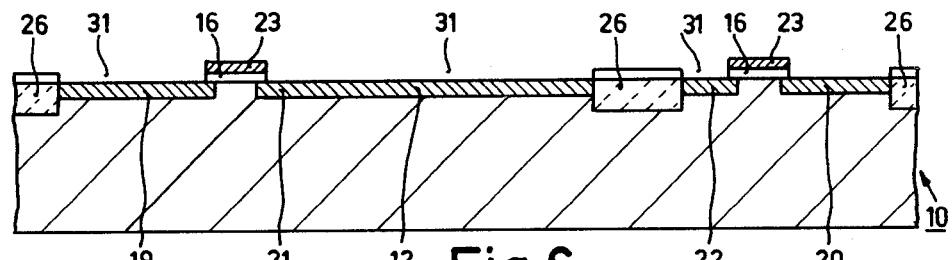
Figure 7:
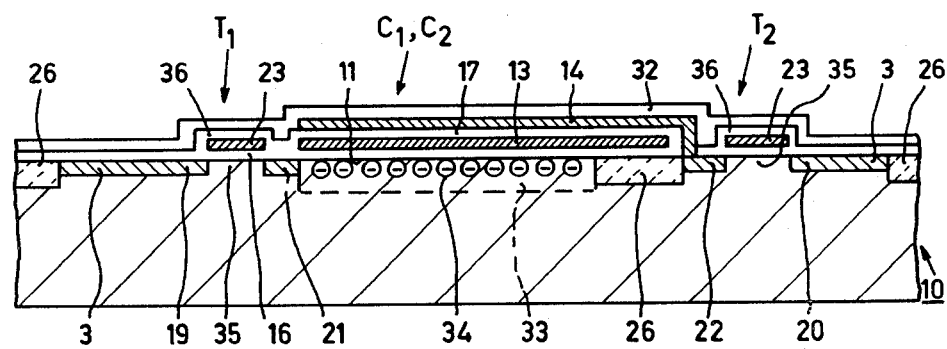
Figure 8:
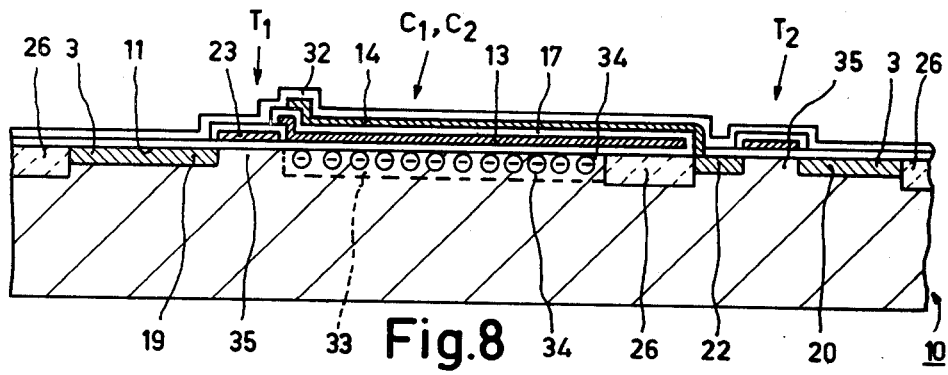
Figure 10:
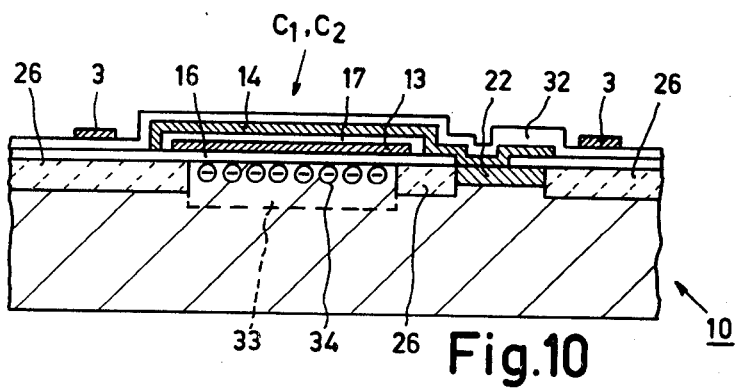
Figure 9:
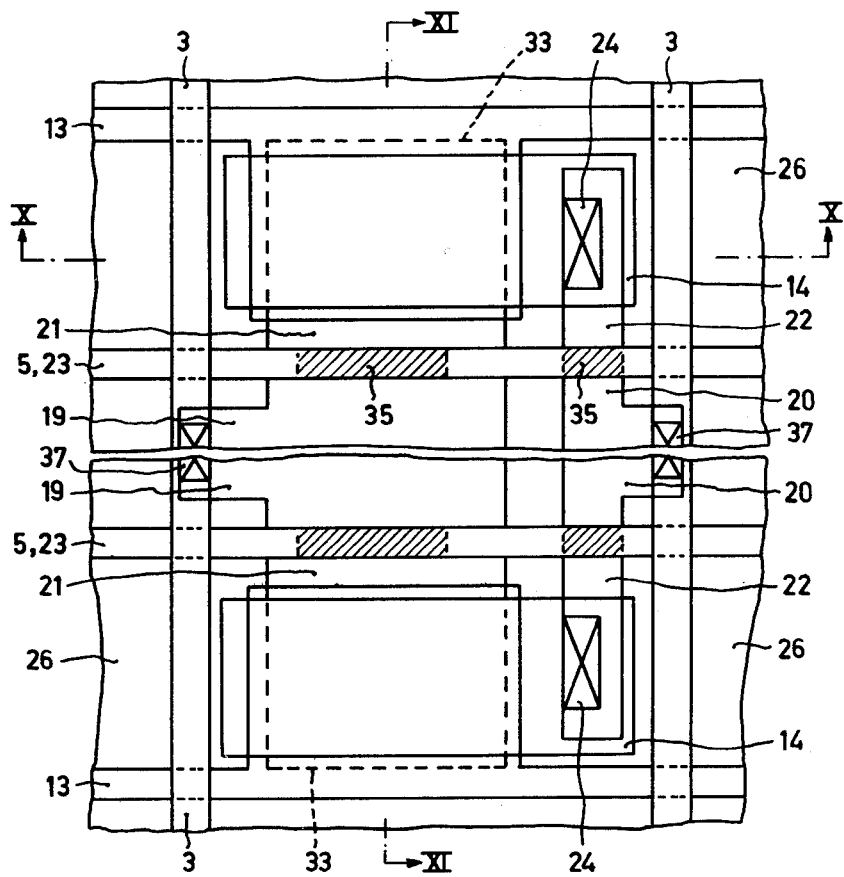

The invention will now be described in greater detail with reference to the drawings, in which FIG. 1 is a plan view of a part of a semiconductor device according to the invention, FIG. 2 is a cross-sectional view of said device taken on the line II—II of FIG. 1, FIG. 3 is a cross-sectional view of said device taken on the line III—III of FIG. 1, FIG. 4 is an electric circuit diagram of a memory device according to the invention, FIG. 5 is a cross-sectional view corresponding to the cross-sectional view of FIG. 2 during the manufacture of the device, FIG. 6 is a sectional view of the device in a further stage of the manufacture, FIG. 7 is a sectional view of a further semiconductor device according to the invention, FIG. 8 is a sectional view of still another semiconductor device according to the invention, FIG. 9 is a plan view of a part of a further device according to the invention, FIG. 10 is a sectional view of said device taken on the line X—X of FIG. 9.

Figure 11:
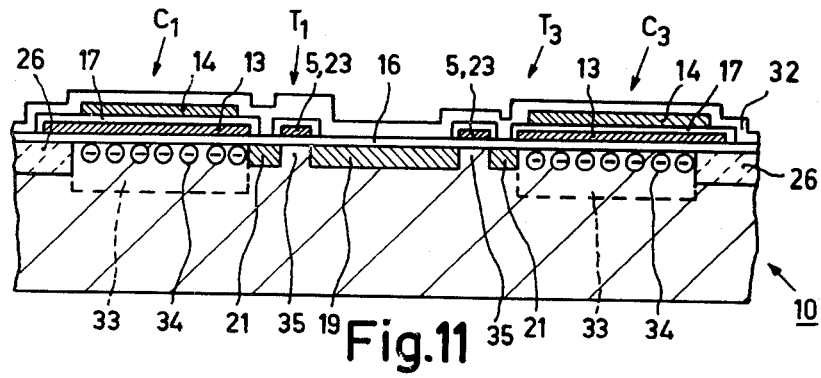

FIG. 11 is a sectional view of said device taken on the line XI—XI of FIG. 9.

It is to be noted that the figures are diagrammatic only and are not drawn to scale.

FIG. 4 shows the electric circuit diagram of a known random access memory device, often referred to in literature by RAM (Random Access Memory). The device comprises an xy-system of a number of memory cells arranged in rows and columns and each comprising a single transistor T and a memory capacitor C. Information in the form of electric charge can be introduced into the capacitors and be stored for a given period of time. An electrode of the capacitors C is connected to a reference potential. Ground potential has been chosen by way of example for such reference potential, but is will be obvious that other suitable potentials, for example, a supply potential, may be used for said reference potential instead of ground. The other electrode of each capacitor is connected to an electric switch, in this case an insulated gate field effect transistor, which is destined for addressing the cell. In order to avoid complexity of the description, the transistor electrode 1 which is connected to the capacitor will hereinafter be referred to as drain and the other transistor electrode 2 will be referred to as source region, although it should be taken into account that during operation the functions of source and drain may interchange within the transistors. Within the same column the source regions 2 of the transistors are connected to y-lines or read lines 3; the gate electrodes 4 of the transistors are connected per row to so-called word lines 5. The read lines 3 are connected to a device 6 which is shown diagrammatically only and which may comprise inter alia an amplifier; the word lines 5 are connected to a decoder 7 which is also shown diagrammatically only. The word lines 5 of the row in which the cell to be read is situated can be selected by means of the decoder.

For reading a given cell there is determined how much charge is stored in the capacitor of the cell. For that purpose, by controlling the word line 5 connected to the gate electrode, the associated field effect transistor of the cell is opened so that the charge of the capacitor can flow to the reading device 6 via the transistor and the read line 3 connected to the source zone of the transistor.

Upon reading, in addition, to the cell to be selected, all other cells in such row are also addressed. In order to maintain the information (charge) stored in these other cells, the reading device 6 usually comprises in addition means to regenerate the charge stored in such cells. The devices 6 and 7 which are otherwise assumed to be known, do not form a specific subject of the present invention, neither as regards structure, nor as regards operation, and will therefore not be further described.

The part of a random access memory shown in FIG. 4 comprises only 9 cells. In general memories of this type comprise at least a few thousand cells. In connection with the large number the dimensions of the memory cells individually will be kept as small as possible so as to obtain a structure which is as compact as possible. The packing density which can be obtained by making the individual cells as small as possible, however, is set, it being a limitation which may be determined by technological and/or electrical restrictions. In a device according to the invention a further increase of the packing density, and hence a reduction of the overall area of the semiconductor body, is obtained by arranging the memory cells not beside each other, as is usual, but partly above each other as will be described with reference to the example shown in FIGS. 1 to 3.

FIGS. 1-3 show in integrated form a part of the circuit shown in FIG. 4 with four complete memory cells. The device comprises a semiconductor body 10 of a suitable semiconductor material. In the present example the body 10 is formed by monocrystalline p-type silicon having a resistivity between 1 and 100 Ohm-cm and preferably between 3 and 10 ohm-cm. Instead of p-type silicon the body 10 may alternatively be n-type silicon—the conductivity types of all the zones in the body being in that case also reversed—or a substrate of n-type silicon having thereon an epitaxially grown p-type layer, or alternatively materials other than silicon.

A series of capacitors $C_1$-$C_4$ each forming part of a memory cell are situated at the surface 11 of the semiconductor body 10. As will be described in greater detail hereinafter, one electrode of each capacitor, hereinafter termed first electrode, is connected to the drain electrode of a field effect transistor $T_1$-$T_4$ which form the electronic switches of the cells by means of which the connections between the capacitors $C_1$-$C_4$ and the read lines 3 can at will be closed or interrupted. The second electrode of each capacitor may be connected to a reference voltage as is shown in the circuit diagram of FIG. 4.

The capacitors form groups of two, in which, in the part shown in the figures, a group is formed by the capacitors $C_1$, $C_2$ and a second group is formed by the capacitors $C_3$ and $C_4$. Each group comprises three conductive layers which, viewed on the surface 11 (FIG. 2), are situated above each other, the capacitors $C_1$ and $C_2$ comprising the layers 12, 13 and 14 and the capacitors $C_3$ and $C_4$ comprising the layers 13, 18 and 15. The central layer of the said three conductive layers—which in both groups is formed by the layer 13—is each time separated from the uppermost and lowermost layers by reverse layers 16, 17. The layers 13 form a common second electrode of the capacitors $C_1$, $C_2$ and $C_3$, $C_4$, respectively. Therefore, capacitor $C_1$ is formed by the layer 13, the reverse layer 16 which forms a dielectric and the layer 12 which forms the first electrode of the capacitor $C_1$ which is connected to the transistor $T_1$. Capacitor $C_2$ is formed by likewise the layer 13, the layer 17 forming a dielectric , and the uppermost conductive layer 14 which forms the first electrode of $C_2$ and is connected to the transistor $T_2$. Analogously, the capacitor $C_3$ is formed by the layer 13, the dielectric layer 16 and the lowermost conductive layer 18 which is connected to the transistor $T_3$; $C_4$ consists of the layer 13, the dielectric 17 and the uppermost conductive layer 15 which is connected to field effect transistor $T_4$. Therefore, the capacitors of each group are entirely slid one into the other and have a common central electrode which is situated between the uppermost and the lowermost electrode layer which are connected to different circuit elements. Because in general the capacitors occupy a comparatively large area, a considerable space saving can be obtained in a device according to the invention without reducing the area of the capacitors and hence their capacitance.

The capacitors could be constructed entirely or partly in the form of rectifying junctions, for example, p-n junctions which are reversely biased, and in which the formed depletion region forms a dielectric. In the present embodiment, however, the central conductive layer 13 is situated on a reverse layer 16 of insulating material covering the surface 11 of the body 10. The insulating layers 16 and 17 in the present example consist of silicon oxide but may, of course, alternatively consist of another suitable insulating material, for example silicon nitride or aluminium oxide, or of a combination of sub-layers of different materials. In order to obtain capacitors having substantially equal capacitances, the dielectrics 16 and 17 are preferably chosen to be so that on an average they have substantially the same ratio between the dielectric constant and the thickness, with a substantially equal area.

The conductive layer 13 with the underlying surface regions 12 and 18, respectively, forms the capacitors $C_1$ and $C_3$ with the intermediate silicon oxide layer 16 as a dielectric. Provided on the central conductive layer 13 is a second reverse layer 17 of silicon oxide with thereon the conductive layers 14, 15 which form the capacitors $C_3$ and $C_4$, respectively, with the conductive layer 13, the insulating layer 17 being the dielectric. In order to obtain capacitors having substantially the same capacitances, the oxide layers 16 and 17 have substantially the same thickness, namely both approximately $0.1/\mu m$. In general, such capacitors having a thin insulating layer between two conductors are to be preferred over capacitors in the form of reverse p-n junctions due to their larger capacity per surface unit and their lower leakage current.

As already noted, the electronic switches betwween the capacitors and the read lines 3 are formed by insulated gate field effect transistors. The use of this type of switches has important advantages, inter alia, that the leakage currents are small, require substantially no control current and that the source and drain zones, as regards their electrical functions, are in general exchangeable. In addition, field effect transistors can in general be integrated in a very easy and compact manner. The transistors of which FIG. 2 shows the elements $T_1$ and $T_2$ each comprise a first zone 19 and 20, respectively, which are connected to the read zones 3 and a second zone 21 and 22, respectively, which are connected to the electrodes 12 and 14, respectively, of the capacitors $C_1$, $C_2$. For convenience, the zones 19 and 20 will hereinafter be referred to as source zones and the zones 21 and 22 as drain zones, although during operation the functions of source and drain zones of the transistors may change. The source and drainzones of the field effect transistors $T_3$ and $T_4$ have been given the same reference numerals as the source and drain zones of the transistors $T_1$ and $T_2$, respectively. Between the source and drain zones of the transistors are situated the gate electrodes 23 which are each separated from the channel region 35 between the source and drain zones by the insulating layer 16.

The transistors T each comprise n-type source and drain zones 19-22 provided in the p-type body 10. Of each group of capacitors $C_1$, $C_2$ and $C_3$, $C_4$ respectively, the lowermost conductive layers 12 and 18, respectively, are formed by a region which forms one assembly with the drain zones 21 of the transistors $T_1$ and $T_3$ which, viewed on the surface, extends to below the central electrode or electrodes 13. In the present embodiment the electrode 13 extends to immediately besides the gate electrodes 23 so that an extra compact structure is obtained.

The electrodes 14 and 15 which, with the layer 13, form the uppermost capacitors $C_2$ and $C_4$, are contacted with the drain zones 22 of the transistors $T_2$, and $T_4$, via contact windows 24 in the oxide layers 16, 17. As shown in FIGS. 1 and 2, the area occupied by said transistors is considerably smaller than the area occupied by the transistors $T_1$ and $T_3$.

The present device forms a part of a matrix in which the memory cells are accommodated in an xy-system of the type as is shown in FIG. 4. The capacitors belonging to the same group form part of memory cells which are connected to the same x-line. The y-lines are alternately connected, via the associated transistors, to columns of capacitors consisting of a central conductive layer 13 and the lowermost conductive layers 12, 18 and to columns of capacitors consisting of a central conductive layer 13 and the uppermost conductive layers 14, 15.

The gate electrodes 23 of the transistors of the memory cell situated in the same x-lines are connected to word lines 5 in the form of aluminium tracks which are contacted to the gate electrodes via contact windows 25 in the oxide layer covering the gate electrodes.

The source zones 19 and 20, of the field effect transistors $T_1$, $T_3$ and $T_2$, $T_4$, respectively, are connected together by y-lines in the form of n-type surface zones 3 which extend in the form of strips in the semiconductor body in a direction transverse to the word lines 5.

The central conductive layer 13 of the capacitors $C_1$–$C_4$ comprises a strip-shaped layer which, viewed on the surface 11, extends between and subsequently parallel to the n-type zones 3 over the insulating layer and forms a common electrode for the capacitors $C_1$–$C_4$ of two juxtaposed y-lines.

As shown in FIGS. 2 and 3 the field effect transistors $T_1$–$T_4$ in the semiconductor body are separated from each other by a pattern 26 of insulating material, in the present case silicon oxide, which is sunk in the semiconductor body 10 and extends between and adjoins the memory cells in the semiconductor body. Below the sunken pattern 26, zones 27 may be provided, if necessary and/or if desired, which have the same conductivity type as but a higher doping than the semiconductor body 10. These zones which are denoted in FIGS. 2 and 3 by broken lines serve to prevent the formation of stray inversion channels which might be formed below the oxide pattern 26 and might form connections between the zones of various juxtaposed cells.

FIGS. 5 to 8 are sectional views corresponding to the sectional view of FIG. 2 of the device during a few stages of the manufacture thereof.

Starting material is the semiconductor body 10 of p-type silicon having a resistivity of approximately 5 ohm.cm which is provided on the surface 11 with a masking layer comprising an oxide layer 28 and a silicon nitride layer 29. In the masking layer 28, 29 which masks the underlying silicon against oxidation, windows 30 are provided photolithographically. Via said windows the body 10 is subjected to a thermal oxidation treatment so as to obtain the sunken silicon oxide pattern 26. The thickness of the oxide pattern 26 is approximately 2 $\mu$m.

It is to be noted that the oxide pattern in the figures is shown diagrammatically only as a pattern which is sunk entirely in the body 10. However, it is possible for the oxide 26 to project slightly above the surface 11 of the semiconductor body 10 because the volume may increase during the oxidation. In the case in which a structure is desired in which the pattern 26 is indeed fully sunk, for example, the body 10, prior to the oxidation, may first be subjected to an etching treatment at the area of the oxide to be provided, or the oxidation treatment may be interrrupted, the oxide already formed may be etched away and the oxidation treatment may then be resumed.

After the oxidation treatment the masking layer 28, 29—which might also be used during further process steps—is removed, after which a fresh oxide layer 16, with thereon a first layer of polycrystalline silicon, is provided on the surface 11. From this first polycrystalline layer, the gate electrodes 23 of the field effect transistors $T_1$–$T_4$ with thereunder the gate oxide 16 may be formed by means of known etching methods. With the sunken oxide pattern 26 the gate electrodes 23 with the underlying oxide layer 16 form a diffusion mask with windows 31 via which the n-type zones 19-22 and the y-lines 3 are provided by diffusion of a suitable impurity, for example phosphorus atoms. At the same time the polycrystalline gate electrodes 23 may also be doped. It is to be noted that the zones 19-22 and the read lines 3 may alternatively be provided by means of ion implantation instead of by diffusion, in which it may not be necessary to also provide the diffusion windows 31 in the oxide layer 16.

The windows 31 in the silicon oxide layer 16 may then be closed again and the polycrystalline silicon electrodes 23 are provided with an oxide layer 36 which may be obtained by subjecting the gate electrodes 23 to an oxidation treatment so that the polycrystalline silicon is partly oxidized. A second doped polycrystalline silicon layer may then be provided from which the common electrodes 13 are formed by etching. This second doped layer may then be provided again with the comparatively thin insulating oxide layer 17, for example by oxidation. After providing the contact windows 24 in the insulating layers present, a third doped polycrystalline silicon layer is provided from which the electrode layers 14 are formed by photolithographic etching which layers are connected at the area of the contact windows 24 to the zones 22 of the transistors $T_2$, $T_4$ and so on.

The silicon oxide layer 32 is then provided, for example by vapour phase deposition, which layer has a comparatively large thickness of approximately 0.5 $\mu$m–1 $\mu$m as compared with the other oxide layers. In the oxide layers present at that area the contact windows 25 are provided above the gate electrodes 23. A layer of a readily conductive metal, for example aluminium, is then provided from which the word lines 5 can be obtained by etching, which lines are connected to the underlying gate electrodes 23 at the area of the contact windows 25.

It is to be noted that the word lines 5 and the conductive layers 14 can alternatively be provided simultaneously instead of in different process steps as in the present example, in which, of course, the geometry should be changed so that the word lines 5 and the layers 14 are not situated above each other but beside each other. The method used in the embodiment, however, has the advantage that the word lines 5 can be provided on the comparatively thick oxide layer 32 so that the stray capacitances between the word lines on the one hand and the capacitors $C_1$–$C_4$ and the transistors $T_1$–$T_4$ on the other hand, can be kept as low as possible.

It is furthermore to be noted that the use of aluminium for the word lines 5 has the advantage that the resistance in the lines 5 is generally lower than when polycrystalline silicon is used, so that the addressing times can also be kept advantageously at a comparatively low value.

Several modifications may be used in the above-described semiconductor devices according to the invention and the method of manufacturing same. FIG. 7 shows an embodiment of such a device, which has been obtained by using a process deviating from the above-described process, in a cross-sectional view corresponding to the sectional view shown in FIG. 2.

For convenience, corresponding components in FIG. 7 are referred to by the same reference numerals as in FIG. 2.

The device shown in FIG. 7 differs from that shown in FIG. 2 mainly in that, of each group of capacitors $C_1$, $C_2$ and so on, the lowermost conductive layer 33 (which contrary to the preceding embodiment, is not formed by an n-type doped region) has majority charge carriers, hence holes, removed therefrom and an n-type inversion layer 34 denoted by $\theta$ sign can be formed therein at the surface 11. The depletion region 33 can be obtained by applying a positive reference voltage with respect to the p-type semiconductor body 10 to the central conductive layer 13—which forms the common electrode of each group of capacitors. The quantity of charge stored in the inversion layer 34 represents the information, for example, a logic "1" or "0". The electric charge required for the formation of the inversion layer can be supplied in a controllable manner by means of the field effect transistor $T_1$ which is connected to the inversion layer 34 via the drain zone 21 adjoining the inversion layer 34.

The device shown in FIG. 7 can be obtained by varying the above-described process in such manner that the common electrodes 13 are provided simultaneously with the insulated gate electrodes 23 and prior to the diffusion treatment to obtain the source and drain zones 19-22 and the read lines 3 by etching the first layer of polycrystalline silicon. Therefore, in this process only two layers of polycrystalline silicon are required, namely a first layer to provide the gate electrodes 23 and the common electrode 13 and a second polycrystalline silicon layer for the provision of the uppermost electrode layer 14 of every two capacitors. As in the preceding embodiment, the uppermost electrode layer is connected to the drain zone 22 of the transistor $T_2$ via a contact window in the oxide layers present.

FIG. 8 is a sectional view corresponding to the sectional view shown in FIG. 2 of a further modified embodiment of the device described in the first embodiment. As in the preceding embodiment, the lowermost electrode layer of each group of capacitors is formed by the depleted surface region 33 having therein the n-type inversion layer 34 adjoining the surface 11. In contrast with the preceding embodiment the transistor $T_1$ does not comprise a diffused n-type drain zone adjoining the inversion layer 34, but the depletion region 33 and the inversion layer 34 formed therein immediately adjoin the channel 35 of the transistor below the gate electrode 23. The electric charge in the inversion layer 34 can be supplied and read, respectively, via the diffused y-lines 3, the source zone 19 and the channel region 35. In this embodiment the central conductive layer 13 is preferably provided so that, viewed on the surface 11, the gate electrode 23 of the transistor $T_1$ is partly overlapped by the electrode layer 13 so as to obtain a good connection between the transistor and the inversion layer 34. For this reason it is preferred in such an embodiment to construct the gate electrodes 23 and the electrodes 13 again in different layers of polycrystalline silicon, as in the first embodiment.

FIG. 9 is a plan view and FIGS. 10 and 11 are sectional views taken on the lines X—X and XI—XI, respectively, of FIG. 9 of a part of a memory device having a geometry which differs slightly from the geometries of the above-described embodiments.

For convenience, the device again has the same reference numerals as the devices according to the preceding embodiments. In the manner as described with reference to the embodiment shown in FIG. 7 the device is constructed in a two-layer-polycrystalline silicon technique, in which the central electrode 13 and the insulated gate electrodes 23 of the transistors are simultaneously manufactured from a first provided layer of polycrystalline silicon and the uppermost electrodes 14 of the capacitor are manufactured from a second layer of polycrystalline silicon. The word lines 5 which connect the gate electrodes 23 of the transistors in the x-direction together, are not formed in the present case by metal strips but also by polycrystalline silicon tracks 5 which can be provided simultaneously with the gate electrodes 23. Therefore, in FIG. 9 these word lines with the gate electrodes are referred to by reference numerals 5, 23. In the places where the tracks 5, 23 are situated above the channel region 35 of the transistors, such tracks are shaded in FIG. 9 for clarity. The word lines 5 can be manufactured simultaneously with the gate electrodes and the electrode layer 13 by not constructing the layer 13 as in the preceding examples in the form of strips extending in the y-direction, but in the form of strips which, as shown in FIG. 9, extend mainly in the x-direction so parallel to the word lines and form common electrodes for the capacitors of the cells connected to the same x-line.

In the y-direction the source zones 19 and 20, respectively, of the transistors are not connected by n-type surface zones extending into the body, but by metal conductors 3 which extend in the y-direction and which are provided on the comparatively thick oxide layer 32 and which are contacted to the zones 19 and 20 via contact windows 37 in the insulating layer.

It is to be noted that in the present embodiment the transistor currents through the channel regions 35 do not flow in the x-direction as above, but in the y-direction. It is furthermore to be noted that the electrode layer 13 between the memory cells is narrower than at the area of the capacitors and thus shows a comb-like structure. As a result of this structure the stray capacitances can advantageously be kept as small as possible.

Furthermore, the device can be manufactured by means of the methods already described.

It will be obvious that the invention is not restricted to the above-described embodiments, but that many variations are possible to those skilled in the art without departing from the scope of this invention.

In the embodiments described the conductivity types may be reversed.

Other materials than those mentioned may alternatively be used advantageously. For example, besides polycrystalline silicon, one or more of the conductive layers of the capacitors may also be of metal, for example aluminium, while for the dielectrics between the conductive layers silicon nitride or aluminium oxide or another suitable insulating material may alternatively be used instead of silicon oxide.

In order to ensure that in the case of non-driven word lines the field effect transistors are closed, the doping concentration of the channel region in the embodiments described can be increased, for example, by means of ion implantation and/or the semiconductor body may be set up at a sufficiently high potential.

I claim:

1. A semiconductor device for storing and reading information, in particular a random access memory device, comprising a semiconductor body having a surface-adjoining series of capacitors, each of said capacitors comprising respective memory cells in which information in the form of electric charge can be introduced during operation of said device, each of said capacitors comprising a first electrode that is connected to an electric switch intended for addressing and a second electrode that can be established at a reference voltage during operation, said capacitors being subdivided into groups of two each, in which said group comprises three conductive layers which, viewed on the surface of the semiconductor body, are situated above each other, the central said conductive layer being separated by barrier layers from the uppermost and the lowermost of said conductive layers, said uppermost and lowermost conductive layers comprising said first electrodes of respective said capacitors, said central conductive layer forming with said first and second electrodes the two respective capacitors of the group, said central conductive layer forming a common section electrode of said capacitors.

2. A semiconductor device as in claim 1, wherein said central conductive layer is situated on a certain insulating layer provided on the surface of the sesmiconductor body, said semiconductor body comprising a surface region that underlies said central conductive layer and forms the said lowermost conductive layer, said central conductive layer and said surface region forming a first capacitor of the group, said device further comprising another insulating layer on said central conductive layer, said other insulating layer having thereon said uppermost conductive layer, which uppermost conductive layer and said central conductive layer forming the second capacitor of the group.

3. A semiconductor device as in claim 2, wherein said insulating layer located between said central conductive layer and said surface of said semiconductor body and said other insulating layer between said central conductive layer and said uppermost conductive layer have substantially the same ratio between the average value for the dielectric constant and the thickness.

4. A semiconductor device as in claim 1, wherein said devices comprise electronic switches that are destined for addressing and each comprise respective insulated gate field effect transistors that comprise respective source and drain zones, the source zone or the drain zone of a said field effect transistor being conductively connected to the first electrode of the capacitor associated with said transistor.

5. A semiconductor device as in claim 4, wherein said semiconductor body or at least a surface-adjoining sublayer thereof is of one conductivity type and said source and drain zones comprise surface zones of second conductivity type opposite to said one conductivity type, said lowermost conductive layer of each said group of capacitors comprising either of the source and drain zones of the associated said transistor, said either zone, viewed on the surface, extending down to below the electrode formed by said central conductive layer.

6. A semiconductor device as in claim 1, wherein said memory cells form an xy-system, those of said capacitors belonging to the same group forming part of memory cells which are connected to the same x-lines and wherein there are connected to adjacent y-lines of the system rows of other cells with capacitors formed by the central conductive layer and the lowermost conductive layer, which other cells alternate with rows of cells with capacitors formed by the central conductive layer and the uppermost conductive layer.

7. A semiconductor device as in claim 6, wherein said gate electrodes of said field effect transistors of the memory cells connected to the same x-line are connected together by word lines and the field effect transistors of the memory cells connected to the same y-line are connected together by strip-shaped surface zones of the opposite conductivity type extending in the y-direction, said central conductive layer of the capacitors comprising a strip-shaped layer which, viewed on the surface, extends between and substantially parallel to said strip-shaped surface zones, each of said capacitors forming a common electrode for capacitors of the cells connected to the same y-line.

8. A semiconductor device as in claim 6, wherein said gate electrodes of said field effect transistors of the memory cells connected to the same x-line are connected together by word lines and said field effect transistors of the memory cells connected to the same y-line are connected together by conductors extending in the y-direction, said gate electrodes extending over the insulating layer provided on said surface of the body and being connected to the source zones of said transistors via windows in said insulating layer, the central conductive layer of the capacitors comprising layers which, viewed on the surface, extend mainly parallel to the word lines and form common electrodes for the capacitors of the cells connected to the same x-line.

9. A monolithically integrated circuit arrangement comprising:

a group of one-transistor storage elements which are arranged on a semiconductor layer and which each have a storage capacitor with first and second electrodes and a selection MIS (metal-insulator-semiconductor) field effect transistor;

the first electrode of the storage capacitor being fed with an information potential to be stored and being conductively connected to the drain zone of the field effect transistor;

source terminals of the field effect transistors of some of the group of storage elements being connected to a common bit line and gate terminals of the field effect transistors of some of the storage elements each being connected to a common word line;

an insulating layer covering a surface of the semiconductor layer;

a first conductive coating arranged above the insulating layer forming a reference electrode which is the second electrode of and which is a common electrode to the storage capacitors of all the storage elements and is connected to a reference potential; and above the first conductive coating and separated from the latter by a further insulating layer a plurality of insulated second conductive coatings being formed as said storage capacitor first electrodes.

10. A circuit arrangement as claimed in claim 9, characterized in that at least one of the first and second conductive coatings comprise a strongly doped polysilicon semiconductor material.

11. A circuit arrangement as claimed in claim 9, characterized in that at least one of the first and second conductive coatings is a metallic coating.

12. A monolithically integrated circuit arrangement comprising:

a group of one-transistor storage elements which are arranged on a semiconductor layer and which each have a selection MIS (Metal-Insulator-Semiconductor) field effect transistor and a storage capacitor with first and second electrodes;

the first capacitor electrode being fed with an information potential to be stored and being conductively connected to the drain zone of the field effect transistor;

source zones of the field effect transistors of a plurality of storage elements of the group being connected to a common bit line;

gates of the field effect transistors of a plurality of storage elements of the group being connected to a common word line;

the storage elements of the group being combined in pairs of first and second storage elements so that regions of first and second storage capacitors of each pair lie one above another with respect to the semiconductor layer;

an insulating layer covering the surface of the semiconductor layer;

a first conductive coating on said insulating layer forming a reference electrode which is a common second electrode for the first and second capacitors and said reference electrode also being a common second electrode for all the storage capacitors of said group of storage elements and is connected to a reference potential;

above the first conductive coating and separated from the latter by a further insulating layer a second conductive coating being arranged for the first of the storage elements of each pair and which forms the first capacitor electrode of the first storage capacitor of each pair; and the first electrode of the second storage capacitor of each pair being formed as a layer at the surface of the semiconductor layer approximately beneath the first electrode of the first storage capacitor of each pair of storage elements.

13. The arrangement of claim 12 in which the first electrode of the second storage capacitor of each pair comprises a diffused layer in the semiconductor layer.

14. The arrangement of claim 12 in which the first electrode of the second storage capacitor of each pair comprises an inversion layer in the semiconductor layer.

15. A circuit arrangement as claimed in claim 12, characterized in that at least one of the first and second conductive coatings comprise a strongly doped polysilicon semiconductor material.

16. A circuit arrangement as claimed in claim 12, characterized in that at least one of the first and second conductive coating is a metallic coating.

17. A monolithically integrated circuit arrangement comprising:

a group of one-transistor storage elements which are arranged on a semiconductor layer and which each have a selection MIS (Metal-Insulator-Semiconductor) field effect transistor and a storage capacitor with first and second electrodes;

the first electrode of the storage capacitor being fed with an information potential to be stored, said first electrode being conductively connected to a drain zone of the field effect transistor in some of the elements of the group and adjacent a shift electrode of a shift type field effect transistor in other elements of the group;

source terminals of the field effect transistors of a plurality of storage elements of the group being connected to a common bit line;

gate terminals of field effect transistors of a plurality of storage elements of the group being connected to a common word line;

the storage elements of the group being combined in pairs of first and second storage elements;

regions of first and second storage capacitors of each pair lying one above another relative to the semiconductor layer;

above an insulating layer covering a surface of the semiconductor layer a first conductive coating being arranged forming a reference electrode as a common second electrode of the first and second capacitors of each pair and which is also common to all the second electrodes of all the storage capacitors of the group of storage elements and is connected to a reference potential;

above the first conductive coating and separated from the latter by a further insulating layer a second conductive coating being arranged which forms the first electrode of the first storage capacitor of each pair;

the second electrode of each of the second storage capacitors of each pair comprising an inversion layer arranged at the surface of the semiconductor layer approximately beneath the first electrode of the first storage capacitor of each pair, said inversion layer extending to a shift electrode of a shift transistor, said shift transistor comprising a shift field effect transistor of each of said second storage elements of the pairs.

18. A circuit arrangement as claimed in claim 17, characterized in that at least one of the first and second conductive coatings comprise a strongly doped polysilicon semiconductor material.

19. A circuit arrangement as claimed in claim 17, characterized in that at least one of the first and second conductive coating is a metallic coating.

* * * * *

UNITED STATES PATENT AND TRADEMARK OFFICE
CERTIFICATE OF CORRECTION

PATENT NO. : 4,460,911
DATED : July 17, 1984
INVENTOR(S) : ROELOF H.W. SALTERS

It is certified that error appears in the above-identified patent and that said Letters Patent is hereby corrected as shown below:

In the claims:

Column 11, line 43 change "sesmiconductor" to --semiconductor--.

Signed and Sealed this

Sixteenth Day of April 1985

[SEAL]

*Attest:*

DONALD J. QUIGG

*Attesting Officer*  *Acting Commissioner of Patents and Trademarks*